(12) United States Patent
Patrick et al.

(10) Patent No.: US 6,309,979 B1
(45) Date of Patent: *Oct. 30, 2001

(54) METHODS FOR REDUCING PLASMA-INDUCED CHARGING DAMAGE

(75) Inventors: Roger Patrick, Mountain View; Stanley C. Siu, Castro Valley, both of CA (US); Luisarita Atzei, Milan (IT)

(73) Assignee: Lam Research Corporation, Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/768,618

(22) Filed: Dec. 18, 1996

(51) Int. Cl.⁷ .................................................. H01L 21/302
(52) U.S. Cl. .................. 438/714; 438/706; 438/710; 438/712; 438/720; 438/732
(58) Field of Search .................. 438/706, 710, 438/712, 714, 720, 732

(56) References Cited

U.S. PATENT DOCUMENTS

| | | | |
|---|---|---|---|
| 4,808,259 | * 2/1989 | Jillie, Jr. ............................... | 156/643 |
| 5,160,407 | 11/1992 | Latchford et al. .................... | 156/656 |
| 5,242,532 | 9/1993 | Cain ..................................... | 156/626 |
| 5,582,679 | 12/1996 | Lianjun et al. ..................... | 156/651.1 |
| 5,667,630 | 9/1997 | Lo ........................................ | 438/653 |

FOREIGN PATENT DOCUMENTS

| | | |
|---|---|---|
| 41 32 564 A1 | 4/1993 | (DE) . |
| 06 053192 A | 2/1994 | (EP) . |
| 07 273093 A | 10/1995 | (EP) . |
| 0 731 501 A1 | 9/1996 | (EP) . |
| 63102318 | * 5/1988 | (JP) . |
| 98/27581 | * 6/1998 | (WO) . |

OTHER PUBLICATIONS

Carter et al., Transformer Coupled Plasma Etch Technology for the Fabrication of SubHalf Micron Structures, J. Vac. Sci. Technol. vol. 11, No. 4, Part 01, Jul. 1, 1993, ©1993 American Vacuum Society, pp. 1301–1306, XP000103733.

Wolfgang E. Frank, "Metal Etch with HI–Addition to Conventional Chemistry," 115 Symposium on VLSI Technology Digest of Technical Papers, Jun. 6, 1995, pp. 91–92, XP000580841.

Cheng et al., "A Novel Technology to Reduce the Antenna Charging Effects During Polysilicon Gate Electron–Cyclotron–Resonance Etching," IEEE Electron Device Letters, vol. 17, No. 7, Jul. 1, 1996, pp. 338–340, XP000595111.

Suguru Tabara, "A New Etching Method for Reducing the Electron Shading Damage Using ICP Etcher", May 13–14, 1996, International Symposium on Plasma Process–Induced Damage.

Hashimoto et al., "Reduction of the Charging Damage from Electron Shading", May 13–14 1996, International Symposium on Plasma Process–Induced Damage.

* cited by examiner

*Primary Examiner*—Michael P. Woodward
*Assistant Examiner*—Mary K. Zeman
(74) *Attorney, Agent, or Firm*—Beyer Weaver & Thomas, LLP

(57) ABSTRACT

A method in a high density plasma chamber for protecting a semiconductor substrate from charging damage from plasma-induced current through the substrate while etching through a selected portion of a conductive layer above the substrate. The method includes performing a bulk etch at least partially through the selected portion of the conductive layer using a first power setting for a plasma generating source of the high density plasma chamber. The method further includes performing a clearing etch through the selected portion of the conductive layer using a second power setting for the plasma generating source. In accordance with this embodiment, the second power setting is substantially minimized to reduce the charging damage.

43 Claims, 6 Drawing Sheets

METHODS FOR REDUCING PLASMA-INDUCED CHARGING DAMAGE

BACKGROUND OF THE INVENTION

The invention relates to the etching of a conductive layer on a substrate. More particularly, the invention relates to methods for protecting a semiconductor substrate from charging damage while etching a conductive layer.

In semiconductor IC fabrication, devices such as component transistors are formed on a wafer or a substrate, which is typically made of silicon. Successive layers of various materials are deposited on the substrate to form a layer stack. These layers are deposited and etched to form the desired components. Metallic interconnection lines, which are etched from the conductive layer of the layer stack, are then employed to couple components together to form the desired circuit.

In etching the various layers of the layer stack, there is employed in the prior art high density plasma etching processes. Advantages associated with high density plasma etching, which are well known, include improved etch rates and etch directionality. It has been found, however, that the etching of the conductive layer may lead to unintended negative consequences.

For example, it has been discovered that the etching of a conductive layer can result in a plasma charging problem Plasma charging is caused when the certain layer, e.g., the conductive layer, picks up positive charges while etching, thereby causing electrons from within the substrate to flow toward the positively charged layer. As is knows, the flow of electrons induces current flow in the opposite direction. The plasma-induced current may flow through some other layers underlying the conductive layer, thereby potentially causing plasma charging damage.

The above plasma charging problem may be better understood with reference to FIG. 1. In FIG. 1, there is shown a plasma region 100, representing the region of the high density plasma processing chamber in which a plasma is struck with reactive etchant source gases. Within plasma region 100, there are reactive ions comprising positive ions 102 and electrons 104. During etching, the reactive ions come into contact with the layers disposed on a substrate 106 and, depending on the selectivities of the layers contacted, may react with some of the contacted layers. In the example of FIG. 1, the layers are shown as photoresist layer 108, conductive layer 110, and field oxide layer 112. In open area 114, some of the reactive ions may even come in contact with the surface of substrate 106.

Positive ions 102 typically follow the potential field that is set up within the high density plasma processing chamber and impact substrate 106, as well as the layers that are disposed thereon, in a generally vertical direction. Consequently, positive ions are said to be anisotropic and are able to penetrate the narrow trenches 122 and 124 between adjacent columns of photoresists, e.g., columns 116, 118 and 120 in photoresist layer 108 to impart a generally positive polarity to underlying conductive layer 110.

Electrons 104, on the other hand, tend to be more isotropic, i.e., they do not follow the potential field set up within the high density plasma processing chamber. Accordingly, a greater percentage of electrons 104 tends to impact the sidewalls of the photoresist columns 116, 118 and 120, thereby imparting a generally negative charge to photoresist layer 108.

The etch rate during the high density plasma process is different for the open area 114 than it is for a narrow trench area, e.g., area 122 located between columns 116 and 118 and a narrow trench area 124 between columns 118 and 120. Because of its faster etch rate the conductive layer will be removed from the open area 114 before it is removed from the narrow trench areas 122 and 124. Once the conductive layer is removed the semiconductor substrate 106 can be directly exposed to the plasma.

Since conductive layer 110 is positively charged, electrons from substrate 106 tend to be attracted thereto. The flow of electrons toward the positively charged conductive layer, e.g., toward a region 126, induces current 128 flow in the opposite direction, e.g., from conductive layer 110 to substrate 106 through region 126. The current 128 path is completed as electrons from plasma region 100 flow into substrate 106 through open area 114. If the current 128 is sufficiently high, components in its path may be destroyed or undesirably altered in its electrical properties.

By way of example, region 126 may, in the case of a MOS (metal oxide semiconductor) transistor, represent a gate oxide region. This gate oxide region 126 may be relatively thin, e.g., about 150 angstroms or below, and may be easily damaged or even destroyed in the presence of even a small plasma-induced current. Alternatively or additionally, the plasma-induced current through gate oxide region 126 may cause charges to be trapped underneath gate oxide region 126. The presence of the trapped charge may undesirably alter the amount of current required to turn on the fabricated transistor. In some cases, the alteration may even render the fabricated transistor unusable.

In view of the foregoing, there are desired improved methods and apparatus therefor that facilitate the etching of the conductive layer in a high density plasma processing chamber. The improved methods and apparatus therefor preferably etches through selected portions of the conductive layer while minimizing charging damage from plasma-induced current.

SUMMARY OF THE INVENTION

The present invention relates to, in one embodiment, a method in a high density plasma chamber for protecting a semiconductor substrate from charging damage from plasma-induced current through the substrate while etching through a selected portion of a conductive layer above the substrate. The method includes performing a bulk etch at least partially through the selected portion of the conductive layer using a first power setting for a plasma generating source of the high density plasma chamber. The method further includes performing a clearing etch through the selected portion of the conductive layer using a second power setting for the plasma generating source. In accordance with this embodiment, the second power setting is substantially minimized to reduce the charging damage.

In another embodiment, the invention relates to a method for protecting a semiconductor substrate from charging damage from plasma-induced current through the substrate while etching through a selected portion of a conductive layer above the substrate. The method includes performing, in a first plasma chamber, a bulk etch at least partially through the selected portion of the conductive layer using a first power setting for a first plasma generating source of the first plasma chamber. There is further included performing, in a second plasma chamber, a clearing etch through the selected portion of the conductive layer using a second power setting for a second plasma generating source of the second plasma chamber. The second power setting is preferably substantially lower than the first power setting to reduce the charging damage.

In yet another embodiment, the invention relates to a method, in a high density plasma chamber that includes a primary plasma generating source for dispensing etchant chemicals, for protecting a semiconductor substrate from charging damage from plasma-induced current through the substrate while etching through a selected portion of a conductive layer above the substrate. The method includes performing a bulk etch at least partially through the selected portion of the conductive layer with a first gap distance between the primary plasma generating source and the substrate. The method further includes performing a clearing etch through the selected portion of the conductive layer with a second gap distance between the primary plasma generating source and the substrate greater than the first gap distance. In this manner, the selected portion of the conductive layer is etched through with lower density plasma during the clearing etch than the plasma employed during the bulk etch.

These and other advantages of the present invention will become apparent upon reading the following detailed descriptions and studying the various figures of the drawings.

BRIEF DESCRIPTION OF THE DRAWINGS

To facilitate discussion of the charging damage problem.

DETAILED DESCRIPTION OF THE PREFERRED EMBODIMENTS

Figure 1:
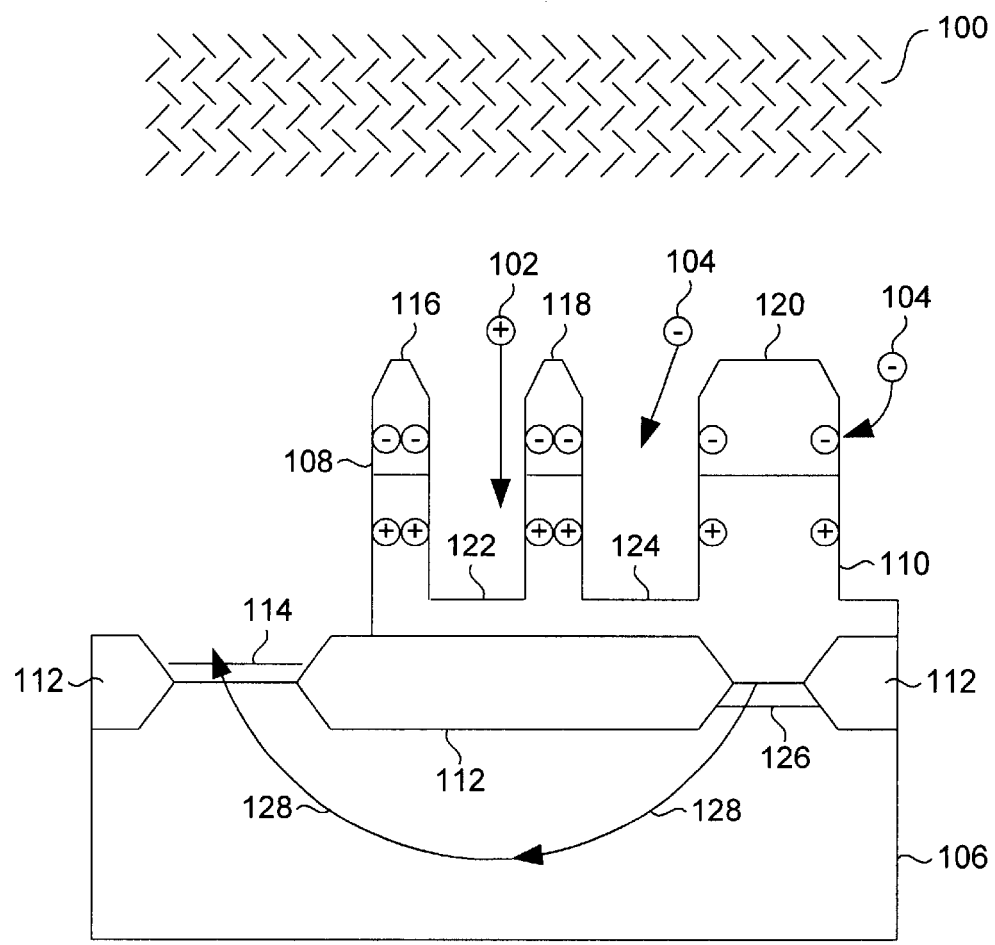
FIG. 1 illustrates a layer stack being etched within a high density plasma processing chamber, including the plasma-induced current that is formed therein.

An invention is described for protecting a semiconductor substrate from charging damage due to plasma-induced current through the substrate while etching through selected portions of the conductive layer. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the aforementioned plasma induced current charging problem is reduced by etching the layers disposed on the substrate, i.e. conductive layer, with an etch process that includes a bulk etch and a clearing etch. The inventive etch technique may be performed in any known high density plasma processing apparatus, including those employing primarily inductive plasma sources such as transformer-coupled plasma (TCP™) coils, whether planar or non-planar. It is contemplated that the invention may be practiced in any of the above mentioned reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma. ECR and TCP™ processing systems, among others, are readily available commercially. TCP™ systems are available from, for example, Lam Research Corporation of Fremont, Calif.

To further elaborate, in a typical plasma etching chamber, the substrate is etched with plasma. The chamber includes an inlet port through which process etchant source gases are fed to the chamber interior. A suitable energy source is applied to a plasma generating source, such as the TCP™ coil or the ECR microwave tube, associated with the chamber to induce a plasma from the etchant source gases. The energy itself may be coupled inductively or capacitively to sustain the plasma, as is known. A bottom bias power independent of the primary plasma generating power source may also be applied to provide independent bias control. Species are then formed from the etchant source gas to react with the layer stack and etch away at the plasma-contacting regions of the substrate layer stack. The by-products are then exhausted through an exit port.

In accordance with one aspect of the invention, there are provided a bulk etch step using a high density plasma and a clearing etch step using a lower density plasma. The bulk etch uses a first power setting for the primary plasma generating source of the high density plasma to etch at least partially through the selected portion of the conductive layer. The clearing etch uses a second power setting for the primary plasma generating source, which is substantially minimized to reduce the charging damage, to etch substantially through the selected portion of the conductive layer.

The bulk etch step applies a relatively high power to the primary plasma generating source to induce high density plasma. The use of high power significantly increases the ion energy and provides a very high etch rate compared to conventional etching. This high etch rate helps keep the system throughput high. If the high density plasma etch is permitted to substantially etch through the conductive layer, as is done in prior art high density etch techniques, the plasma induced current may, however, cause damage to some of the layers underlying the conductive layer in the manner discussed in connection with FIG. 1.

In accordance with another aspect of the present invention, the high density plasma etch step is terminated before the conductive layer is substantially etched through. A clearing etch is performed at some point after the bulk etch. The clearing etch is intended to remove the remainder of the conductive layer in areas unprotected by the photoresist and complete the etching process while minimizing charging damage from plasma induced current. Generally the clearing etch is a short etch relative to the bulk etch. Accordingly, the faster etch rate of the high density etch can be employed for most of the etch and the short duration of the relatively slower low plasma density etch does not substantially affect the system throughput.

Figure 2:
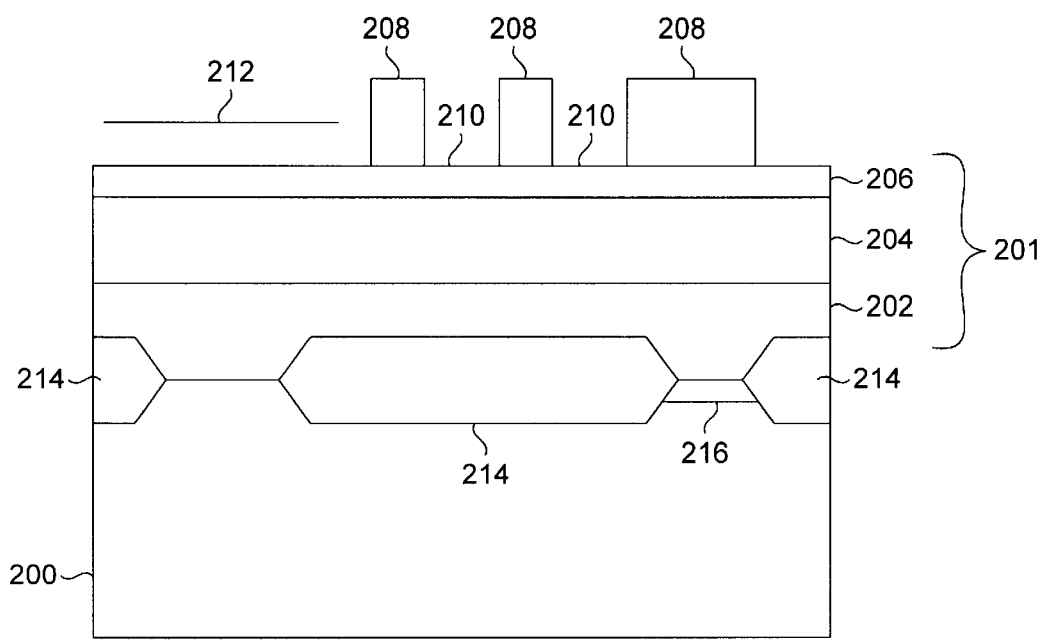
FIG. 2 illustrates a layer stack before the etching (bulk etch and clearing etch) process takes place.
Figure 3:
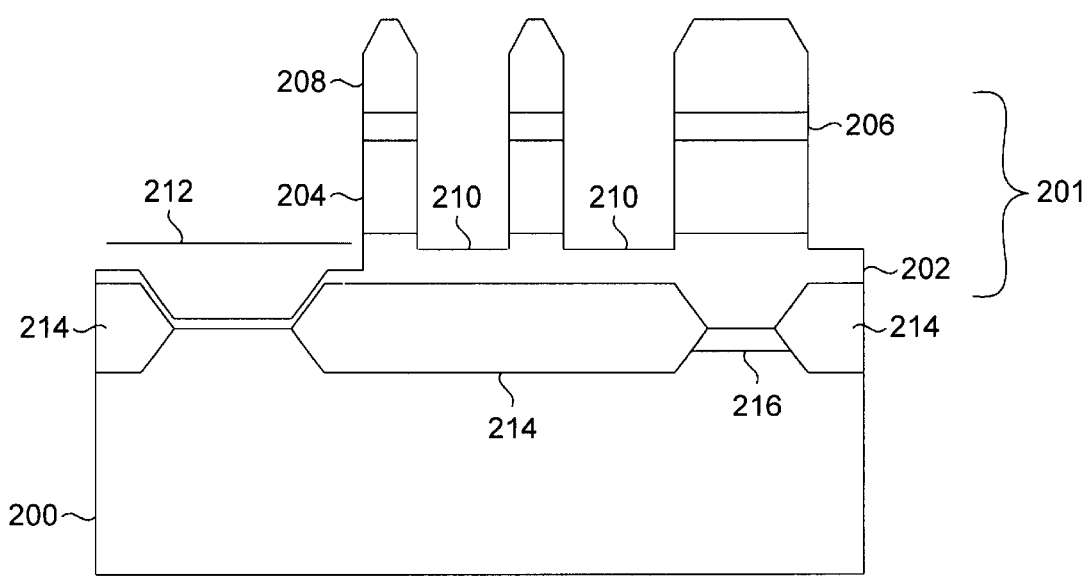
FIG. 3 illustrates, in one embodiment, the same layer stack after the bulk etching step is completed.
Figure 4:
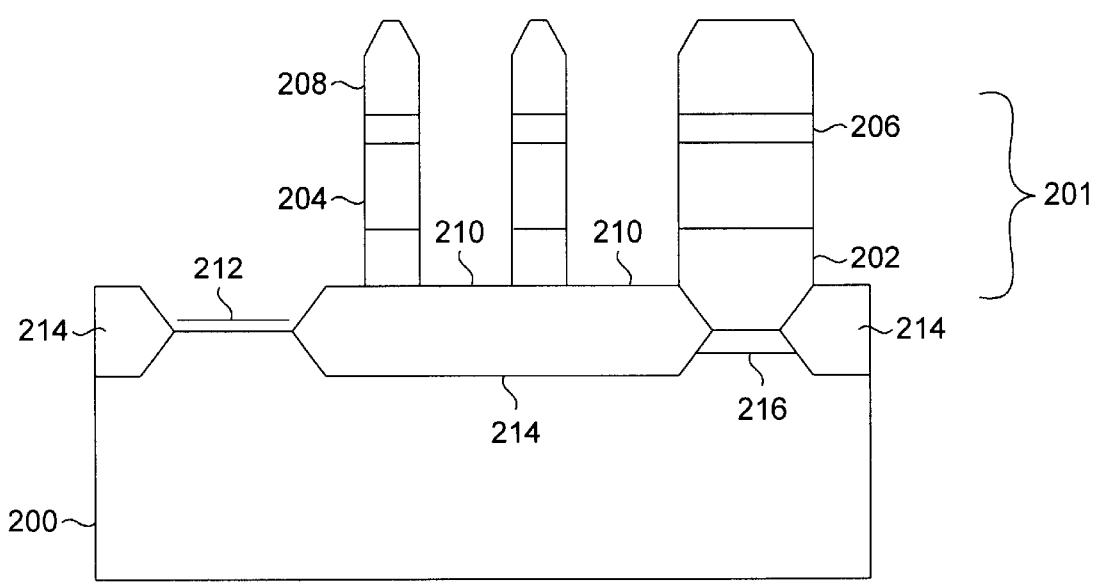
FIG. 4 illustrates, in one embodiment, the same layer stack after the clearing etch step is completed.

To furthers elaborate, the inventive etching process including the bulk etch and clearing etch is now described with reference to FIGS. 2, 3 and 4. FIG. 2 illustrates a layer stack before the etching (bulk etch and clearing etch) process takes place. FIG. 3 illustrates the same layer stack after the bulk etching step is completed. FIG. 4 illustrates the same layer stack after the clearing etch step is completed.

Referring to FIG. 2, the exemplar layer stack includes a semiconductor substrate 200, a barrier layer 202, a conductive layer 201 (consisting of a barrier layer 202, a metallization layer 204, and an anti-reflective coating 206 in the present example), and a patterned photoresist layer and/or hard mask 208 having narrow trenches 210 and open areas 212 in which the photoresist has been removed. Between the semiconductor substrate 200 and the barrier layer 202 are regions of field oxide 214 and a gate oxide 216. The etching process removes conductive material of conductive layer 201 from the narrow trenches 210 and open areas 212 to form a desired pattern. As mentioned above, it should be noted that other additional layers which have not been described may be present above, below, or between the conductive layer and the other layers of the layer stack. Further, not all of the described layers need to be present and some or all may be substituted by other different layers.

The bulk etch etchant source gas includes, in one embodiment, two components, chlorine ($Cl_2$) and boron trichloride ($BCl_3$), mixed at a first $Cl_2:BCl_3$ flow ratio. Chlorine ($Cl_2$), as is known in the art, is an active etchant gas commonly used for etching metallization layers such as alumina Typically, boron trichloride ($BCl_3$) is added to the chlorine as a passivation agent in order to reduce the erosion of the photoresist layer during the etching process. The $BCl_3$ may also help prevent undercutting of the sidewalls of the layer stack during the etching process. However, adding $BCl_3$ to the etchant source gas may have several disadvantages. These disadvantages may include reducing the etch rate which slows down the etching process. It is believed that $BCl_3$ also reduces the etch rate selectivity to photoresist and etch rate uniformity. Furthermore, $BCl_3$ may increase the microloading and profile microloading problems associated with the etching process. Therefore, it is desirable to use only the amount of $BCl_3$ in the etchant source gas that is necessary to prevent excessive erosion of the photoresist and prevent the undercutting of the layer stack sidewalls.

Note that although $Cl_2$ and $BCl_3$ are the source gases typically used to etch metallization layers of aluminum, they are not the only gases suitable for this purpose. Different sources gases may also be used for aluminum or different metallization layers. Although aluminum is typically used as the metallization layer, polysilicon as well as tungsten can also be used. If aluminum is employed, titanium nitride (TIN) may also be employed to form the anti-reflective coating (ARC) layer and the barrier layer (shown in FIG. 2 as layers 206 and 202 respectively). The three layer sandwich that comprises the conductive layer may be etched with the same $Cl_2/BCl_3$ chemistry in one embodiment. It should be understood that the inventive technique disclosed herein is independent of the specific chemistry employed. In some instances, fluorine based etchant source gases may be employed in place of the chlorine based etchant source gases. For example, as is known in the art, fluorine based etchant source gases, such as $SF_6$, are believed to be better suited for etching a conductive layer containing tungsten. As a further example, HBr or $SF_6$ may be employed, in some cases, for etching a polysilicon conductive gate layer.

FIG. 3 illustrates the layer stack of FIG. 2, after the bulk etch is completed. As shown, the high density plasma of the bulk etch step has etched through the anti-reflective coating layer 206, the metallization layer 204 and part of the barrier layer 202. For example, portions of the anti-reflective coating layer 206, the metallization layer 204 and part of the barrier layer 202 have been removed from the narrow trench areas 210 and the open area 212. The bulk etch is stopped once metallization layer 204 is etched through but before the three layer sandwich comprising the conductive layer of FIG. 2 is completely etched through. The etch of the barrier layer 202 is not completed with the bulk etch high density plasma in order to protect gate oxide 216. If barrier layer 202 is etched through employing the bulk etch, the current induced by the high density plasma may damage or destroy oxide gate 216 as discussed in connection with FIG. 1.

The timing of the end of the high density plasma etch is important to the protection of layers underlying the conductive layer such as gate oxide 216. In one embodiment, the duration of the bulk etch step may be predefined, e.g., through experimentation. If the aforementioned three layer sandwich is employed for the conductive layer, the depth of the bulk etch step may be monitored by sensing the reduction in the 261 nm optical emission, which signifies that the aluminum layer is etched through. The high density etch may be terminated immediately to avoid etching the underlying barrier layer with high density plasma. The high density etch may be continued for 6 to 10 seconds in one embodiment, after the aluminum layer etch has been etched through to partially etch the barrier layer 202. Note that the material removal rate may be faster over the open area 212 than in narrow trench 210. Thus remaining barrier layer 202 may be thinner in the open area than it is in the narrow trench areas 210. To prevent the exposure of high density plasma to the semiconductor substrate causing plasma induced current, the bulk etch should be terminated before the barrier layer 202 is etched away from the open area 212.

FIG. 4 illustrates the layer stack of FIG. 3 after the clearing etch is completed. During the clearing etch, the power to the plasma generating source, e.g., the TCP™ coil is reduced or turned off; thereby reducing the primary plasma density to levels that will not cause charging damage even when the semiconductor substrate is exposed to the plasma. The clearing etch etchant source gas may include in one embodiment $Cl_2$ and $BCl_3$, mixed at the same $Cl_2:BCl_3$ flow ratio as the bulk etch or at a $Cl_2:BCl_3$ flow ratio that may be different than the bulk etch flow ratio. Again other etchant source gas mixtures may be used.

With the lower density plasma, the remainder of the barrier layer 202 is removed, thereby completing the etch step through conductive layer 201. Low density plasma tends to have a slower etch rate than high density plasma. To compensate for this etch rate reduction, various other etch rate parameters may be changed to improve the etch rate of the clearing etch step. These etch rate improving parameters include: increasing the etchant source gas flow rate, increasing the pressure within the process gas chamber and increasing the bias power. Although increasing the source gas flow rate, increasing the chamber pressure and increasing the bias power improve throughput, these changes are not required to protect the layers underlying the conductive layer, e.g., gate oxide 216, from charging damage.

The specific processing parameters and conditions suitable for employing the inventive bulk etch/clearing etch method depend upon, among others, the specific type and geometry of the reactor, the composition of the conductive layer, the thickness of the conductive layer, the etchant gases employed, the size of the substrate and the like. For one specific example, Tables 1 and 2 respectively summarize approximate process parameter ranges for the bulk etch step and the clearing etch step. In Tables 1 and 2, the conductive layer etch is performed in a high density plasma reactor known as the Model 9600 TCP™, available from Lam Research Corporation of Fremont, Calif. The substrate etched is an 8-inch wafer having a conductive aluminum layer approximately 3,000–10,000 angstroms thick disposed thereon. This conductive aluminum is masked by a photoresist layer about 0.8–1.5 microns thick. All of the variations of the following ranges have not been tested. However, experiments have indicated that these ranges may be useful depending upon the specific reactor utilized and the particular substrate to be etched.

TABLE 1

Bulk Etch Parameters

| | Suitable Range | Preferred Range | More Preferred Range |
|---|---|---|---|
| TCP ™ Power | 250–1,000 W | 400–700 W | 500 W |
| Pressure | 2–90 mT | 6–20 mT | 15 mT |
| Bias Power | 50–500 W | 100–300 W | 170 W |
| $Cl_2$ Flow Rate | 0–200 sccm | 10–150 sccm | 36 sccm |
| $BCl_3$ Flow Rate | 0–200 sccm | 10–150 sccm | 18 sccm |
| $N_2$ Flow Rate | 0–50 sccm | 0–25 sccm | 8 sccm |

As indicated in Table 1, the power to the TCP™ coil for the bulk etch step may range from about 250 W to about 1,000 W, more preferably from about 400 W to about 700 W and even more preferably be about 500 W. It should be borne in mind these exemplary power ranges are suitable for use in the specific exemplary TCP™ reactor, and other power ranges may well be employed for generating suitable high density plasma for the bulk etch step in other reactor systems. For example, it is contemplated that higher power ranges, e.g., 1,500–3,000 W in some cases, may be employed in some helicon or ECR systems.

The reactor chamber pressure for the bulk etch may range from about 2 mT to about 90 mT, more preferably from about 6 mT to about 20 mT and even more preferably be about 15 mT. The bias power applied to the chuck in the reactor chamber during the bulk etch step as indicated in Table 1, may range from about 50 W to about 500 W, more preferably from 100 W to 300 Watts and even more preferably be about 170W.

The $Cl_2$ component of the bulk etch etchant gas mixture for this configuration, may range from about 0 sccm (standard cubic centimeters per minute) to about 200 sccm, more preferably from about 10 sccm to about 150 sccm and even more preferably about 36 sccm. For this example, the $BCl_3$ component of the bulk etch etchant gas mixture may range from about 0 sccm to about 200 sccm, more preferably from about 10 sccm to about 150 sccm and even more preferably about 18 sccm. The $N_2$ component of the bulk etch etchant gas mixture may range from about 0 sccm to about 50 sccm, more preferably from about 0 sccm to about 25 sccm and even more preferably about 8 sccm

TABLE 2

Clearing Etch Parameters

| | Suitable Range | Preferred Range | More Preferred Range |
|---|---|---|---|
| TCP ™ Power | 0–300 W | 0–150 W | 0 W |
| Pressure | 2–90 mT | 6–50 mT | 35 mT |
| Bias Power | 50–500 W | 100–400 W | 350 W |
| $Cl_2$ Flow Rate | 0–200 sccm | 10–150 sccm | 100 sccm |
| $BCl_3$ Flow Rate | 0–200 sccm | 10–150 sccm | 67 sccm |
| $N_2$ Flow Rate | 0–50 sccm | 0–25 sccm | 0 sccm |

As indicated in Table 2, the power to the TCP™ coil for the clearing etch step may range from about 0 W to about 300 W, more preferably from about 0 W to about 150 W and even more preferably be about 0 W. For this configuration, the reactor chamber pressure for the clearing etch may range from about 2 mT to about 90 mT, more preferably from about 6 mT to about 50 mT and even more preferably be about 35 mT. The bias power as indicated in Table 2, applied to the chuck in the reactor chamber during the clearing etch step may range from about 50 W to about 500 W, more preferably from 100 W to 400 W and even more preferably be about 350 W.

The $Cl_2$ component of the clearing etch etchant gas mixture for this configuration, may range from about 0 sccm to about 200 sccm, more preferably from about 10 sccm to about 150 sccm and even more preferably about 100 sccm. For this example, the $BCl_3$ component of the clearing etch etchant gas mixture may range from about 0 sccm to about 200 sccm, more preferably from about 10 sccm to about 150 sccm and even more preferably about 67 sccm. The $N_2$ component of the clearing etch etchant gas mixture may range from about 0 sccm to about 50 sccm, more preferably from about 0 sccm to about 25 sccm and even more preferably about 0 sccm.

Although plasma density may be reduced in the clearing etch step by reducing power to the primary plasma generating source, e.g., the TCP™ coil (whether planar or nonplanar) power as discussed in FIG. 4, parallel plates and/or ECR microwave, other techniques of plasma density reduction are possible for protecting a semiconductor substrate from charging damage while etching the conductive layer. A different embodiment of the inventive etching process including the bulk etch and clearing etch is now described. In this embodiment, the plasma density between bulk and clearing etches are altered by mechanical means.

Figure 5:
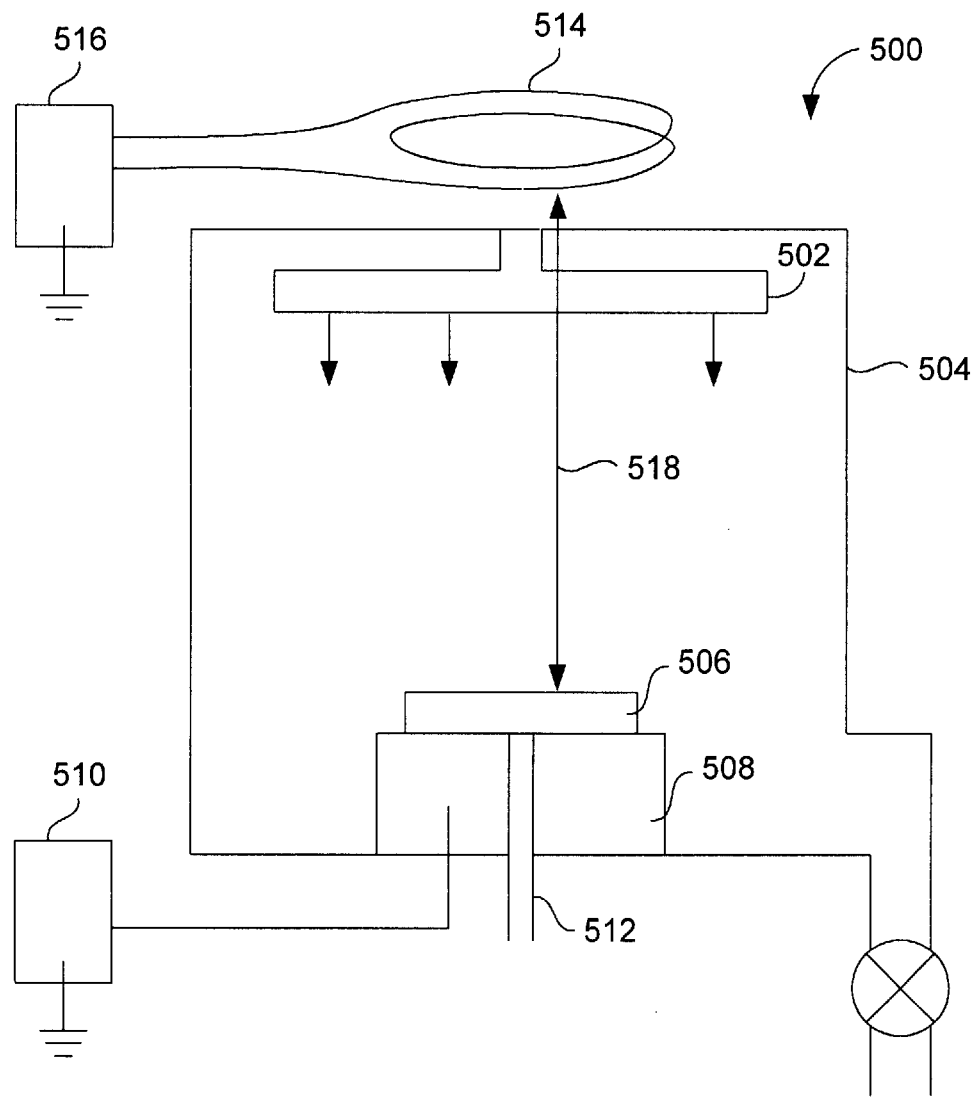
FIG. 5 illustrates a simplified schematic of a plasma reactor, to facilitate discussion of the inventive etching technique.

FIG. 5 illustrates a simplified schematic of a plasma reactor 500, to facilitate discussion of the embodiment. Generally, reactor 500 includes a shower head 502 which preferably includes a plurality of holes for releasing gaseous source materials, i.e., the etchant source gases, into an RF-induced plasma chamber 504. The gaseous source materials may also be released by other means, e.g., from ports built into the walls of the chamber itself or gas rings disposed within the chamber. A substrate 506 is introduced into chamber 504 and is disposed on chuck 508, which holds the substrate in place. Chuck 508 may mechanically or electrostatically hold the substrate in place during the inventive etching process. Chuck 508 also acts as an electrode and is preferably biased by a radio frequency (RF) generator 510. Helium cooling gas may be introduced under pressure through port 512 between chuck 508 and substrate 506 to act as a heat transfer medium for accurately controlling the substrate's temperature during processing to ensure uniform and repeatable etching results.

A second electrode 514 representing the primary plasma generating source is disposed above chamber 504 and takes the form of a coil. However, the primary plasma generating source may be implemented in other conventional manners, including employing the aforementioned parallel plates and microwave source. Coil electrode 514 is energized by a RF generator 516 via a matching network (conventional and not shorn in FIG. 5). RF generators 510 and 516, through chuck 508 and electrode 514, are used to strike a plasma in the etchant source gas within chamber 504 in order to etch substrate 506.

The gap 518 between the substrate 506 and the primary plasma generating source, electrode 514, may be altered to mechanically control the density of the plasma during the etching process. In some systems, electrode 514 and shower head 502 may be allowed, but not required, to move together. The relative plasma density may decrease by increasing gap 518, keeping all other control parameters the same or changing the parameters to optimize the etch rate as discussed in connection with FIG. 4. To reduce the plasma density during the clearing etch step, gap 518 may be increased from that used during the high plasma density bulk etch step.

Referring to FIG. 5, the mechanical method of plasma density control may be applied to the present bulk/clearing etch invention. The bulk etch is stopped once the conductive layer is partially etched through. A bulk etch step is performed on the substrate with relatively high density plasma. During the bulk etch, the high density plasma etches through, in one embodiment, the anti-reflective coating, the metallization layer and part of the barrier layer in selected areas. The parameter settings for the high density plasma bulk etch may include: power to the TCP™ coil, chamber pressure, bias power, $Cl_2$ flowrate, $BCl_3$:flowrate, $N_2$ flowrate and gap 518 between the showerhead 502 and the substrate 506. The depth of the etch may be determined in one embodiment by monitoring the reduction in the 261 nm optical emission, which may indicate that the aluminum layer is etched through. The barrier layer is not etched through during the bulk etch to avoid charging damage from current induced by the high density plasma.

Again referring to FIG. 5, after the bulk etch, the substrate proceeds through a clearing etch step to remove the remainder of the conductive layer, thereby exposing the semiconductor substrate and field oxide in the etched areas. During the clearing etch the plasma density within chamber 504 is reduced by increasing the gap 518 between the primary plasma generating source, electrode 514, and the substrate 506. The other parameters including power to the TCP™ coil, chamber pressure, bias power, $Cl_2$ flowrate, $BCl_3$ flowrate, and $N_2$ flowrate, do not necessarily have to be changed in order to reduce the plasma density to a level that will not induce sufficient current to cause charging damage to semiconductor substrate. However, some of these parameters may be altered to achieve other goals, e.g., to increase the system throughput. With the larger gap 518, the clearing etch with lower plasma density can be facilitated.

Although the previous embodiments have illustrated the bulk and clearing etch in a single machine, in another embodiment of the present invention, the bulk etch can be performed in one etching chamber while the clearing etch can be performed in a different etching chamber. The advantage of using different machines for the different etch steps is that some plasma reactors may be better suited for high density plasma etching, while other plasma reactor designs may be better suited for lower density plasma etching. In particular the etch uniformity during the clearing etch may be improved by using a machine specifically designed for low density plasma etching like a reactive ion etch (RIE) machine. While high density plasma etching machines are capable of performing low density plasma etching, a better product may be produced by using different machines for the bulk and clearing etch steps.

Figure 6:
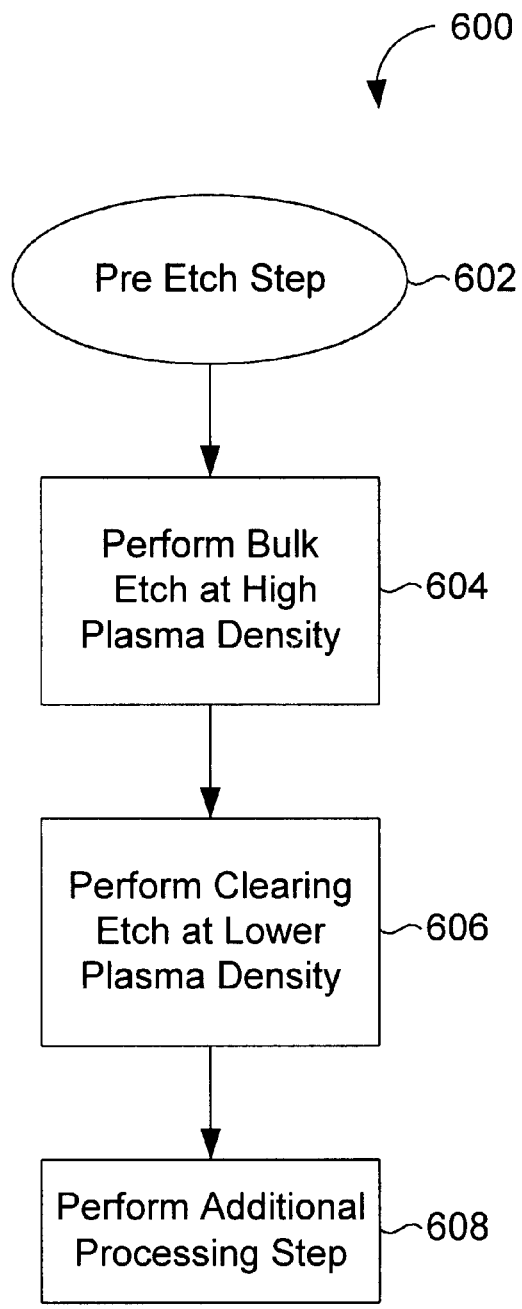
FIG. 6 shows, in accordance with one aspect of the present invention, the steps involved in the inventive conductive layer etch process.

FIG. 6 shows, in accordance with one aspect of the present invention, the steps involved in an inventive etch process 600. In step 602, a substrate is prepared for etching in a conventional pre-etch step. The pre-etch step may include, for example, clamping the substrate onto chuck, stabilizig the pressure within the plasma processing chamber, and introducing helium cooling gas to the substrate backside to facilitate heat transfer between the substrate and the chuck.

In step 604, the layer stack is etched using the bulk etch process parameters. As mentioned, the bulk etch parameters are designed to achieve a high plasma density etch through the conductive layer. In one embodiment, the plasma may be considered high density if its density is above about $10^{10}$ $cm^{-3}$.

After the bulk etch step 604, a clearing etch step 606 is performed. In clearing etch step 604, the layer stack is etched using the clearing etch parameters. The clearing etch parameters are configured to etch the layer stack using a lower density plasma than the plasma density with which the bulk etch step 604 is conducted. In one embodiment, the plasma may be considered low density if its density is below about $10^{10}$ $cm^{-1}$. As discussed, the plasma density may be reduced, in one embodiment, by reducing the power supplied to the primary plasma generating source, e.g., TCP™ coil, parallel plates and/or ECR microwave. In another embodiment, the gap between the primary plasma generating source and the substrate may be increased to reduce the plasma density. The clearing etch step is employed as a clean up etch to finish the conductive layer etch while protecting the semiconductor substrate from high density plasma that can cause charging damage as described in FIG. 1.

Additional processing step 608 may include other deposition and/or etching steps to complete fabrication of the desired device. Additionally, additional processing step 608 may include a cool-down step followed by a declamping, and removal step wherein the substrate is removed from the plasma processing chamber. Additionally, additional processing step 608 may include using the substrate to create one or more integrated circuits by cutting the wafer into dies and processing the dies using conventional integrated circuit techniques. Alternatively, the substrate may be processed into a variety of devices, e.g., a liquid crystal display panel or semiconductor IC devices. These devices may then be incorporated in an electronic products, e.g., any number of well known commercial industrial or consumer electronic products, including computers.

While this invention has been described in terms of several preferred embodiments, there are alterations, permutations, and equivalents which fall within the scope of this invention. For example, although the conductive layer may include multiple layers, it may also be a single layer, e.g., a single aluminum layer. Additionally, it should be recognized that the inventive technique applies not only to the etching of metal or interconnect layer(s) but also to gate etches wherein a conductive gate material comprising any suitable conductive material, e.g., conductive polysilicon, is etched. Of course the etchant source gases and/or etch parameters should be optimized, as can be appreciated by those skilled, to the material being etched.

Additionally, although the specific embodiment is discussed with reference to a metal oxide semiconductor (MOS) device to facilitate ease of understanding, it should be appreciated that the inventive technique for reducing plasma-induced charging damage also applies to the fabrication of other types of devices wherein it is desired to minimize charging damage, during an etch, of the layers underlying the layer being etched. For example, the inventive technique may be employed during the etching of devices forming a flat panel display out of a substrate. As a further example, the inventive technique may be employed during the etching of the interconnect layer, e.g., the first interconnect layer, of an static random access memory (SRAM) device. It is believed that the inventive technique is also helpful during the resistive etch (e.g., etching of the polysilicon resistive layer of an SRAM device) or the transistor gate etch (e.g., etching of the conductive layer such as a conductive polysilicon layer that comprises the gate). It should also be noted that there are many alternative ways of implementing the methods of the present invention. It is therefore intended that the a following appended claims be interpreted as including all such alterations, permutations, and equivalents as fall within the true spirit and scope of the present invention.

What is claimed is:

1. A method for protecting a semiconductor substrate from charging damage from plasma-induced current through said substrate while etching, in a plasma in a high density plasma chamber, through a selected portion of a conductive layer above said substrate, comprising:

providing said semiconductor substrate, said semiconductor substrate having a surface, said surface having a gate oxide region covered by a thin gate oxide layer, said surface having a field oxide region covered by a field oxide layer, and said surface having a first region, said field oxide region being located between said gate oxide region and said first region, said conductive layer covering said substrate and laying over said thin gate oxide, over said field oxide and over said first region of said surface of said substrate;

providing an etch mask over said conductive layer, said etch mask protecting said conductive layer over said thin gate oxide region said etch mask having an opening exposing said selected portion of said conductive layer, said selected portion of said conductive layer extending over said first region and over a portion of said field oxide region;

performing a bulk etch partially through said selected portion of said conductive layer using a first power setting for a plasma generating source of said high density plasma chamber and terminating said bulk etch while a remainder of said selected portion of said conductive layer remains to be etched; and performing a clearing etch through said remainder of said selected portion of said conductive layer using a second power setting for said plasma generating source, thus exposing said first region of said surface of said substrate to said plasma while using said second power setting, said second power setting being substantially minimized to reduce said charging damage by reducing said plasma-induced current flowing from said conductive layer through one of said thin gate oxide region and through said substrate to said first region of said surface of said substrate.

2. The method of claim 1 wherein said high density plasma chamber is an inductively coupled plasma chamber.

3. The method of claim 2 wherein said second power setting is about 0 W to about 150 W.

4. The method of claim 3 wherein said second power setting is about 0 W.

5. The method of claim 1 wherein said high density plasma chamber is a transformer coupled plasma chamber.

6. The method of claim 1 wherein said high density plasma chamber represents an electron cyclotron resonance chamber.

7. The method of claim 1 wherein a chamber pressure within said high density plasma chamber during said clearing etch is greater than a chamber pressure within said high density plasma chamber during said bulk etch.

8. The method of claim 7 wherein said chamber pressure within said high density plasma chamber during said clearing etch step is about 2 mTorr to about 90 mTorr.

9. The method of claim 8 wherein said chamber pressure within said high density plasma chamber during said clearing etch step is about 6 mTorr to about 50 mTorr.

10. The method of claim 9 wherein said chamber pressure within said high density plasma chamber during said clearing etch step is about 35 mTorr.

11. The method of claim 1 wherein a flow rate for an etchant source gas mixture within said high density plasma chamber during said bulk etch is lower than during said clearing etch.

12. The method of claim 11 wherein a flow rate of $Cl_2$ during said clearing etch is about 0 standard cubic centimeters per minute (sccm) to about 200 sccm.

13. The method of claim 12 wherein said flow rate of said $Cl_2$ during said clearing etch is about 10 sccm to about 150 sccm.

14. The method of claim 1 wherein said conductive layer on said semiconductor substrate consists of a material sandwich including a first layer of titanium nitride, a layer of a aluminum and a second layer of titanium nitride.

15. The method of claim 14 wherein an etchant source gas employed during said bulk etch includes $Cl_2$ and $BCl_3$.

16. The method of claim 1 wherein said conductive layer is a conductive layer employed for fabricating an SRAM device.

17. The method of claims wherein said conductive layer is a conductive layer employed for fabricating a CMOS logic device.

18. A method for protecting a semiconductor substrate from charging damage while etching through a selected portion of a conductive layer above said substrate, the etching being performed in a plasma in a plasma chamber, the charging damage being formed from a plasma induced current through said substrate, comprising:

providing said semiconductor substrate, said semiconductor substrate having a surface, said surface having a gate oxide region covered by a thin gate oxide layer, a field oxide region covered by a field oxide layer, and a first region, said field oxide region being located between said gate oxide region and said first region, said conductive layer covering said substrate and laying over said thin gate oxide, over said field oxide and over said first region of said surface of said substrate;

providing an etch mask over said conductive layer, said etch mask protecting said conductive layer over said thin gate oxide region, said etch mask having an opening exposing said selected portion of said conductive layer, said selected portion of said conductive layer extending over said first region and over a portion of said field oxide region;

performing a bulk etch partially through said selected portion of said conductive layer using a high density plasma and terminating the bulk etch while a remainder of said selected portion of said conductive layer remains to be etched; and performing a clearing etch through said remainder of said selected portion of said conductive layer using a low density plasma, thus exposing said first region of said surface of said substrate to said plasma while using said low density plasma, the density of said low density plasma being substantially minimized to reduce said charging damage by reducing said plasma-induced current flowing from said conductive layer through one of said thin gate oxide region and through said substrate to said first region of said surface of said substrate.

19. The method of claim 18 wherein the bulk etch applies a first power setting to a plasma generating source of said plasma chamber to induce said high density plasma, and wherein the clearing etch applies a second power setting to said plasma generating source of said plasma chamber to induce said low density plasma.

20. The method of claim 19 wherein said second power setting is substantially lower than said first power setting.

21. The method of claim 18 wherein the plasma density between the bulk and clearing etches are altered by a mechanical means.

22. The method of claim 21 wherein a gap, between the substrate and a plasma generating source of said plasma chamber, is altered to mechanically control the density of the plasma during said bulk and clearing etches.

23. The method of claim 22 wherein said bulk etch is performed with a first gap distance between said plasma generating source and said substrate, and wherein said clearing etch is performed with a second gap distance between said plasma generating source and said substrate, said second gap distance being larger than said first gap distance.

24. The method of claim 18 wherein the bulk and clearing etches are performed in a single plasma chamber.

25. The method of claim 18 wherein the bulk etch is performed in a first plasma chamber suitable for high density plasma etching, and wherein the clearing etch is performed in a second plasma chamber suitable for low density plasma etching.

26. The method of claim 18 wherein the plasma chamber is a transformer coupled plasma chamber.

27. The method of claim 18 wherein the plasma chamber is an electron cyclotron resonance chamber.

28. The method of claim 18 wherein said conductive layer represents a metallization layer.

29. The method of claim 18 wherein said conductive layer represents a conductive polysilicon layer.

30. The method of claim 18 wherein said conductive layer over said semiconductor substrate consists of a material sandwich including a first layer of titanium nitride, a layer of aluminum and a second layer of titanium nitride.

31. The method of claim 18 wherein said conductive layer is a conductive layer employed for fabricating an SRAM device.

32. The method of claim 18 wherein said conductive layer is a conductive layer employed for fabricating a CMOS logic device.

33. A method of etching through a conductive layer disposed underneath a mask layer and above a substrate, said method comprising:

performing a bulk etch step comprising etching a first portion of said conductive layer through said mask layer using a plasma with a first plasma density;

wherein said bulk etch step is terminated while a remainder of the conductive layer remains to be etched;

performing a clearing etch step comprising etching through the remainder of the conductive layer using a plasma with a second plasma density;

wherein the second density is substantially minimized relative to the first density to reduce charging damage caused by a current flowing from the conductive layer to the underlying substrate.

34. The method as recited in claim 33 wherein the conductive layer comprises three layers.

35. The method as recited in claim 33 wherein the conductive layer comprises an antireflective coating layer, a barrier layer, and a metallization layer disposed between the antireflective coating and the barrier layer.

36. The method as recited in claim 35 wherein the bulk etch step comprises etching through the antireflective coating layer, the metallization layer and a portion of the barrier layer.

37. The method as recited in claim 35 wherein the bulk etch step is terminated before etching through the barrier layer.

38. The method as recited in claim 35 wherein the antireflective coating layer is formed from titanium nitride, the metallization layer is formed from aluminum, and the barrier layer is formed from titanium nitride.

39. The method as recited in claim 33 wherein the same etch chemistry is used to perform the bulk and clearing etch steps.

40. The method as recited in claim 39 wherein the etch chemistry includes $Cl_2$.

41. The method as recited in claim 33 wherein the bulk etch step applies a first power setting to a plasma generating source to induce a high density plasma, and wherein the clearing etch step applies a second power setting to the plasma generating source to induce a low density plasma.

42. The method as recited in claim 33 wherein the plasma density is decreased during the clearing etch step by increasing a gap between a plasma generating source and the substrate.

43. The method as recited in claim 33 wherein the first plasma density is greater than $10^{10}$ cm$^{-3}$, and wherein the second plasma density is less than $10^{10}$ cm$^{-3}$.

* * * * *